United States Patent [19]

Kmetz

[11] Patent Number: 4,583,180
[45] Date of Patent: Apr. 15, 1986

[54] FLOATING POINT/LOGARITHMIC CONVERSION SYSTEM

[75] Inventor: Gerald L. Kmetz, San Jose, Calif.

[73] Assignee: National Semiconductor Corporation, Santa Clara, Calif.

[21] Appl. No.: 461,729

[22] Filed: Jan. 28, 1983

[51] Int. Cl.[4] .............................................. H03M 7/24
[52] U.S. Cl. .................................... 364/715; 364/748; 235/310
[58] Field of Search ....................... 364/715, 748, 722; 235/310

[56] References Cited

U.S. PATENT DOCUMENTS

| 3,436,533 | 4/1969 | Moore et al. | 364/715 |
| 3,631,230 | 12/1971 | Chen | 364/715 |
| 4,062,014 | 12/1977 | Rothgordt et al. | 235/310 |
| 4,078,250 | 3/1978 | Windsor et al. | 364/715 |

OTHER PUBLICATIONS

Andrews, "Algorithm for Finding Logarithms of Binary Numbers to the Base Two" *IBM Tech. Disclosure Bulletin,* vol. 11, No. 8, Jan. 1969, pp. 914–916.
Lo, "Binary Logarithms for Computing Integral and Non-Integral Roots and Powers" *International Journal of Electronics,* vol. 40, No. 4, pp. 357–364, Apr. 1976.

*Primary Examiner*—David H. Malzahn
*Attorney, Agent, or Firm*—Michael J. Pollock; Paul J. Winters; Gail W. Woodward

[57] ABSTRACT

A digital transformation system for converting between logarithm functions and floating point functions very quickly by normalizing the floating point number in the range of one to two, and adapting one function as the other function, after a correction, which correction is generated by a ROM using the one function as an address.

11 Claims, 5 Drawing Figures

FIG. 1
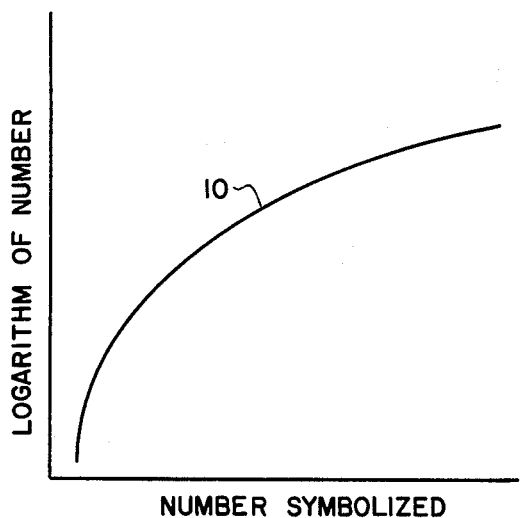
FIG. 2
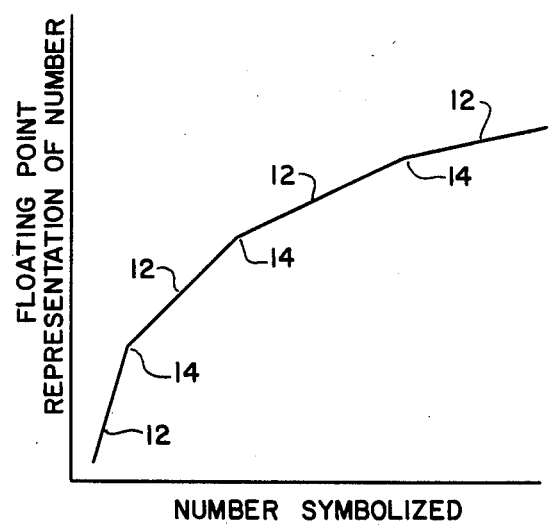
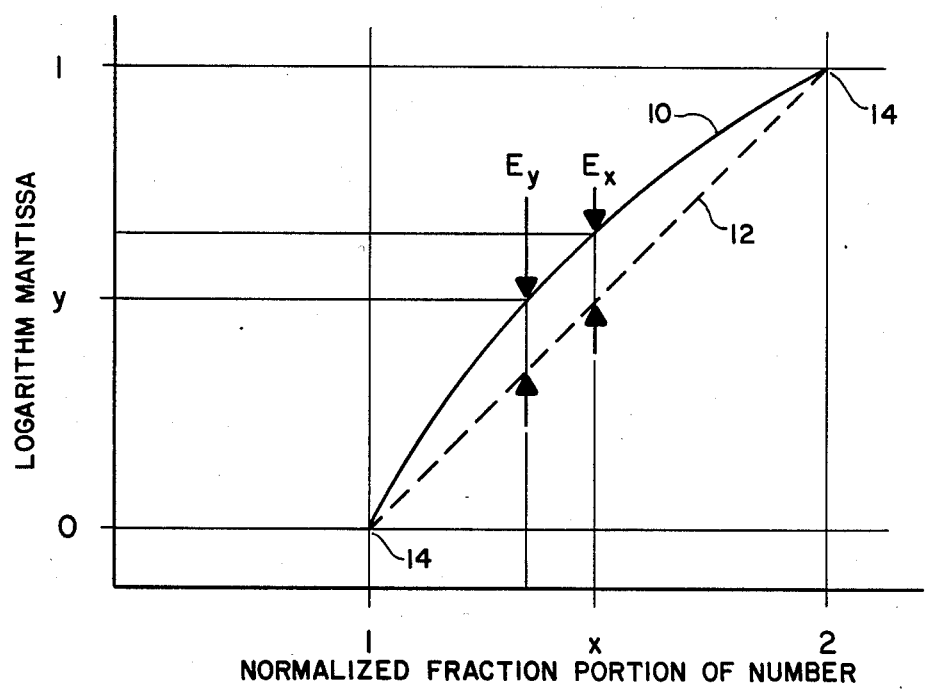
FIG. 3

FLOATING POINT/LOGARITHMIC CONVERSION SYSTEM

BACKGROUND

In some categories of digital calculation, such as signal analysis for speech recognition, it is useful to be able to deal with numbers having a wide dynamic range and yet still perform calculations at high speed. Simple integer arithmetic is fast but the dynamic range is limited unless a very large word can be processed.

Floating point arithmetic has evolved in the prior art in order to more efficiently handle a wide dynamic number range with a word length of manageable size. In a floating point system the word is divided into two parts. The first or exponent part comprises perhaps five bits and represents the power to which one raises two in order to get the approximate number. The dynamic range of numbers that can be represented thus extends from zero all the way through two raised to the thirty-second power, a very wide range indeed. This first exponent part is then multiplied by a second or fractional part comprising perhaps eleven bits in order to fully define the number. The fractional part, or fraction, is normalized so that it always lies within a limited range of values with the highest value being twice the lowest value, in keeping with the doubling of the number upon each increment of the exponent part. Usually a range of 0.5 to 1 is used. During calculations, if the fraction overflows or underflows the desired range, the exponent is simply incremented or decremented, as needed, and the fraction is shifted in the direction required to keep it normalized within the limited range. Hence, a sixteen bit word will suffice to represent a dynamic range of numbers much greater than would otherwise be possible.

The drawback of floating point arithmetic is that it may be too slow for applications such as digital speech analysis and recognition, an application which requires both speed and wide dynamic range. A floating point multiplication, for example, requires that the exponents be added together to establish the exponent of the product. The fractions are then multiplied together and shifted as needed to normalize the result. The product's exponent is then adjusted in accordance with the number of shifts. All this is very time consuming especially considering how long it takes to simply multiply the two eleven bit fractions. My invention achieves great speed increases by converting the floating point number into a logarithm so that a multiplication or division of numbers may be achieved by the simple addition or subtraction of their logarithms.

SUMMARY OF THE INVENTION

Logarithms have a form analogous to floating point numbers, the only difference being that floating numbers utilize only integer exponents and span the numbers in between with a linear fractional multiplier whereas logarithms utilize a continuous spectrum of exponents to represent the number and thus need not be multiplied by a fractional quantity in order to fully define the number. A logarithm exponent is traditionally divided into a portion to the left of the decimal point that comprises whole or integer numbers, called the characteristic, and a portion to the right of the decimal point called the mantissa. If one chooses a base of two for the logarithm it turns out that, mathematically, the characterstic is the same thing as the floating point exponent. The mantissa is nearly the same thing as the fraction provided certain normalization ranges are used.

Thus, by a judicious choice of base for the logarithm, coupled with an optimum choice of ranges for the floating point fraction, one can readily convert one to another with only minor errors. Furthermore, the errors are known and predictable so that they can be compensated for with a simple look-up table in ROM memory. My invention performs this conversion and adjustment with a circuit that simplifies the memory look-up task by using the fraction or mantissa as the address for the error that needs to be corrected to make the fraction into the mantissa or vice versa. With this ability to change rapidly between floating point numbers and logarithms, any computer can make lightning fast multiplications by converting to logarithms, adding the logarithms together, and then converting back to floating point. Division would subtract the logarithms. Since the conversion is an approximation, the results are not as accurate as a full long multiplication, of course, but often accuracy is not essential. In speech recognition signal analysis, for example, the results of many multiplications are averaged together so that accuracy is not contingent upon any one multiplication.

BRIEF DESCRIPTION OF THE DRAWINGS

FIGS. 1 and 2 chart the relation of logarithms and floating point representations to the numbers they symbolize.

FIG. 3 graphs the differences between the fraction and the mantissa over the chosen normalization range.

DESCRIPTION OF THE PREFERRED EMBODIMENT

Figure 4:
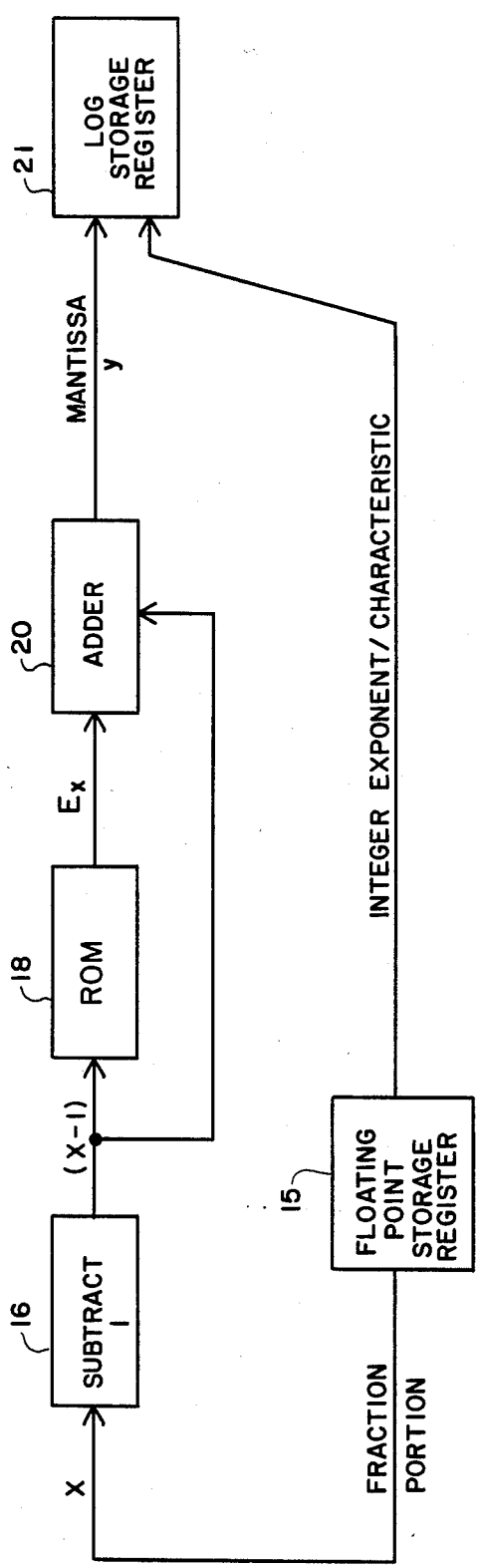
FIGS. 4 and 5 show the circuits (if done in hardware) or the methods (if done in software) to convert from fraction to mantissa and from mantissa to fraction.

In FIG. 1 it may be seen that as a number symbolized increases, its logarithm increases, although at a progressively lesser rate, along a smooth curve 10. A floating point representation does nearly the same thing, as shown in FIG. 2, except that a series of straight line segments 12 make up the curve due to the fact that floating point systems represent the numbers between the exponents with a linear fractional multiplier. Since the preferred embodiment floating point representation is based on the binary, or base two, number system, it is advantageous to use logarithms to the base two. If this is done, each of the vertices 14 in FIG. 2 will lie on curve 10 if the graphs are superimposed. In between the vertices, the difference between the fraction and the mantissa may be calculated for each position along the curve and stored in a table in memory. Once the number is normalized, the same values from the table may be used for any segment 12, for they are all made identical by the normalization process.

FIG. 3 shows a typical segment in the optimum range of normalizations with the straight floating point segment 12 shown as a dashed line and the logarithmic segment 10 shown as a solid line. The floating point normalization range is chosen to run from one to two and the logarithm normalization range from zero to one. This is advantageous in simplifying the circuitry because the logarithm to the base two (or any base for that matter) of one is zero and the logarithm to the base two of two is one. So with these particular ranges, as the fraction goes from one to two, the logarithm goes from zero to one. It becomes very simple, therefore, to simply subtract one from the fraction X and produce a fractional number that is nearly the same as the mantissa Y.

By way of example, suppose X was about 1.500 as it's shown in FIG. 3. The mantissa would be a little more than 0.500 because curve 10 follows a different higher path than straight line 12. Accordingly, the mantissa is always a bit greater than the fraction except at the vertices 14 where they are equal. The difference or error $E_X$ must be added to the fraction.

The error $E_X$ can be calculated and stored in memory to be addressed by the fraction number 0.500 (coded in binary, of course). The value of $E_X$ can then be added to 0.500 to yield the mantissa. This is exactly what the circuit of FIG. 4 does. The floating point function or representation is taken from whatever location 15 in which it normally appears. The integer exponent is transferred directly to the logarithm storage location 21 to be used as the log characteristic. The fraction portion X is split off to be modified into the mantissa Y. The number "one" is subtracted from X by subtractor 16 to produce the first approximation of mantissa Y. This approximation quantity of $(X-1)$ is used directly to address a read-only-memory or ROM 18 which has been coded to output the unique error $E_X$ for that fraction. An adder 20 then adds the error $E_X$ to the quantity $(X-1)$ to produce the mantissa. Subtractor 16, ROM 18, and adder 20 may all comprise dedicated hardware for maximum speed. Alternatively, one could write a short program to permit a conventional microprocessor to use its standard memory sources and ALU to perform the steps of subtracting one, looking up the error for the resulting quantity, and adding that error to the resulting quantity. In this second case, FIG. 4 may be thought of as a flow chart depicting a method of performing the transformation.

Figure 5:
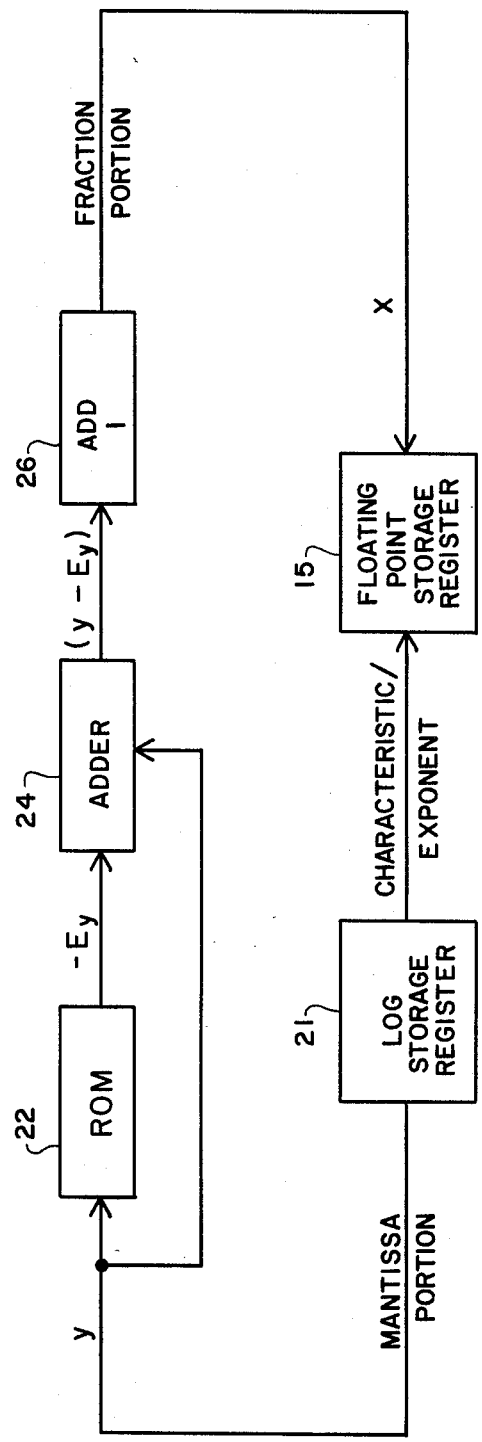

Once the numbers are converted to logarithms, multiplication can be achieved by adding the logarithms together. The product is then obtained by converting the product's logarithm back to a floating point number by a similar transformation process. If, for example, the logarithm Y was 0.500 in FIG. 3, it can be seen that the corresponding fraction would be somewhat lower than 0.500 by a correction quantity $E_Y$. To obtain $E_Y$, the circuit of FIG. 5 is employed.

In FIG. 5, again, the integer exponent is obtained directly from the log characteristic portion. The mantissa portion Y is split off to be transformed into the fraction portion. The mantissa Y is used to address a ROM 22 which then produces the correction $-E_Y$. An adder 24 combines the numbers to produce the quantity $(Y-E_Y)$ which is then added to one by another adder 26. The final output is the complete fraction, a number lying between one and two. Again, the transformation shown in FIG. 5 could be accomplished by dedicated hardware or generalized hardware using special software.

Several variations to the apparatus are possible without departing from the spirit and scope of the invention. For example, ROM space could be conserved by storing errors for just half of the range shown in FIG. 3 since the upper and lower halves of the curves are very similar. To do this a central location on the curve may be chosen to comprise address zero with a deviation, either above or below address zero, being used as is, without sign, to generate an error quantity approximately appropriate to either conversion. Another variation would be to divide the ranges into any arbitrarily large number of subdivisions so as to enhance accuracy to any degree desired. The only limit on this variation would be the number of bits available to code the fraction, mantissa, or address. Because of the possible variations, I intend to be limited only to the appended claims.

I claim:

1. Apparatus in a digital computation system for high-speed conversion of a floating point representation of a number into a logarithmic representation of said number, said floating point representation having a fractional portion and a floating point characteristic and said logarithmic representation having a mantissa portion and a log characteristic, said apparatus comprising:
    first means responsive to said fractional portion for providing an additive correction thereto having a value substantially equal to the difference between the normalized fractional portion of the corresponding number and said mantissa portion; and
    second means for combining said additive correction with said normalized fractional portion so as to produce said mantissa portion.

2. The apparatus of claim 1, wherein said first means includes normalization means for normalizing said fractional portion to said floating point representation;
    wherein said first means provides a predetermined additive correction having a value substantially equal to the difference between the normalized fractional portion and said mantissa portion.

3. The apparatus of claim 2 wherein said fractional portion is normalized to lie in the range of 1 to 2, whereby said additive corrections lie in the range of 0 to less than 1.

4. The apparatus of claim 2 wherein said first means comprises a memory storing predetermined additive corrections.

5. The apparatus of claim 4 wherein said normalized fractional portion defines an address in said memory for the corresponding correction.

6. The apparatus of claim 4 wherein said fractional portion is normalized to lie in the range of 0 to 1, wherein said first means includes:
    means for calculating from said fractional portion the address in said memory of the corresponding additive correction.

7. Apparatus in a digital computation system for high-speed conversion of a logarithmic representation of a number into a floating point representation, said logarithmic representation having a mantissa portion and a log characteristic and said floating point representation having a fractional portion and a floating point characteristic, said apparatus comprising:
    first means responsive to said mantissa portion for providing an additive correction thereto having a value substantially equal to the difference between the fractional portion of the corresponding number and said mantissa portion; and
    second means for combining said additive correction with said mantissa portion so as to produce said fractional portion.

8. The apparatus of claim 7 wherein said first means comprises a memory storing predetermined additive corrections.

9. The apparatus of claim 8 wherein said second means further comprises:
    first adding means for forming the sum of said mantissa portion and the corresponding additive correction; and second adding means responsive to said sum for adding a factor of 1 thereto so as to produce a fractional portion of said floating point representation.

10. In a system employing logarithmic and floating point representations of numbers, said logarithmic representation having a mantissa portion and a log characteristic and said floating point representation having a fractional portion and a floating point characteristic, apparatus for converting back and forth between the mantissa and fractional portions of said representations at high speeds comprising:

memory means for storing a plurality of additive correction values representing the differences between mantissa and fractional portions corresponding to the same numbers; and means operable to retrieve said correction values from said memory means and to selectively combine each such retrieved correction value with each of the mantissa portion and fractional portion corresponding thereto so as to selectively convert each portion into the corresponding counterpart portion.

11. The apparatus of claim 10 wherein each said mantissa and fractional portions defines an address in said memory for the additive correction corresponding thereto.

* * * * *